United States Patent
Kao

(10) Patent No.: US 8,699,296 B2
(45) Date of Patent: Apr. 15, 2014

(54) DYNAMIC PHASE SHIFTER AND STATICIZER

(75) Inventor: I-Feng Kao, Redwood Shores, CA (US)

(73) Assignee: Oracle International Corporation, Redwood Shores, CA (US)

(*) Notice: Subject to any disclaimer, the term of this patent is extended or adjusted under 35 U.S.C. 154(b) by 237 days.

(21) Appl. No.: 13/272,822

(22) Filed: Oct. 13, 2011

(65) Prior Publication Data

US 2013/0094311 A1 Apr. 18, 2013

(51) Int. Cl.
*G11C 8/00* (2006.01)

(52) U.S. Cl.
USPC ............... 365/233.1; 365/129; 365/233.11; 365/233.12

(58) Field of Classification Search
USPC ............... 365/129, 233.1, 233.11, 233.12
See application file for complete search history.

(56) References Cited

U.S. PATENT DOCUMENTS

| | | | | |
|---|---|---|---|---|
| 3,575,609 A | * | 4/1971 | Izumi | 377/79 |
| 3,644,750 A | * | 2/1972 | Campbell | 326/96 |
| 3,812,520 A | * | 5/1974 | Baker | 326/15 |
| 8,161,441 B2 | * | 4/2012 | Wang et al. | 716/108 |

* cited by examiner

*Primary Examiner* — Fernando Hidalgo
(74) *Attorney, Agent, or Firm* — Osha Liang LLP

(57) ABSTRACT

A dynamic phase shifter and staticizer circuit and method includes a clock domino configured to receive a phase memory signal from a memory array and a clock signal and output the intermediate signal, and a staticizer configured to receive the intermediate signal from the clock domino and the clock signal and output a static memory signal. The static memory signal is shifted by one clock cycle from the phase memory signal. Setup and holding is done with respect to the clock edge, shifting the output of the clock domino, and the received phase memory signal can borrow into the next cycle when being sampled. The phase memory signal is converted from a half-cycle in length to the static memory signal that is a full-cycle in length.

20 Claims, 4 Drawing Sheets

DYNAMIC PHASE SHIFTER AND STATICIZER

BACKGROUND OF INVENTION

1. Field of the Invention

One or more embodiments of the present invention relate generally to a dynamic phase shifter and staticizer capable of staticizing an input signal and shifting the signal to a next cycle for pipeline purposes while decreasing the critical path timing.

2. Background Art

Latches and flip-flops are widely used state elements. Latches are state elements that hold a particular state for a half clock cycle, whereas flip-flops are state elements that hold a particular state for a full clock cycle. Flip-flops are commonly called latches when the flip-flops are simple transparent or opaque flip-flops and are mainly used as storage elements. When describing flip-flops it is likely that the flip-flops are clocked synchronous or edge-triggered. Flip-flops may not only be used for state storage but may also be used for synchronizing signals such as memory arrays which are dynamically accessed, and therefore, the data coming out of the memory arrays is dynamic in nature. Conventional flip-flops, which incur a high timing, power and circuit cost, may help flop the dynamic memory signals coming from the dynamically accessed memory arrays; however, additional circuitry, time delay, and power consumption is required in order to at least staticize a signal.

SUMMARY OF INVENTION

In one or more embodiments, the present invention relates to a dynamic phase shifter and staticizer circuit which includes a clock domino configured to receive a phase memory signal from a memory array and a clock signal and output an intermediate signal, and a staticizer configured to receive the intermediate signal from the clock domino and the clock signal and output a static memory signal, wherein the static memory signal is shifted by one clock cycle from the phase memory signal.

In one or more embodiments, the present invention relates to the clock signal which includes a clock edge, and a different phase than the phase memory signal, where setup and holding is done with respect to the clock edge, shifting the output of the clock domino, and where the received phase memory signal can borrow into the next cycle when being sampled.

In one or more embodiments, the present invention relates to the dynamic phase shifter and staticizer circuit configured to sample the phase memory signal after a rising edge of the clock signal has been received by the dynamic phase shifter and staticizer circuit, and wherein the dynamic phase shifter and staticizer circuit is configured to sample the phase memory signal before a falling edge of the clock signal is received by the dynamic phase shifter and staticizer circuit.

In one or more embodiments, the present invention relates to the clock domino including a p-channel field-effect transistor ("P-FET") and at least a first n-channel field-effect transistor ("N-FET"), a second N-FET, and a third N-FET connected in series, wherein the P-FET gate is configured to receive the clock signal, the P-FET drain is connected to $V_{DD}$, and the P-FET source is connected to the first N-FET drain, wherein the first N-FET gate is connected to $V_{DD}$ and the first N-FET source is connected to the second N-FET drain, wherein the second N-FET gate is configured to receive the phase memory signal and the second N-FET source is connected to the third N-FET drain, and wherein the third N-FET gate is configured to receive the clock signal and the third N-FET source is connected to $V_{SS}$. The output from the clock domino is output from between the P-FET source and the first N-FET drain.

In one or more embodiments, the present invention relates to the staticizer including a second P-FET, a fourth N-FET, and a fifth N-FET connected in series, wherein the second P-FET gate is configured to receive the output of the phase memory signal from the clock domino, the second P-FET drain is connected to $V_{DD}$, and the second P-FET source is connected to the fourth N-FET drain, wherein the fourth N-FET gate is configured to receive the clock signal and the fourth N-FET source is connected to the fifth N-FET drain, and wherein the fifth N-FET gate is configured to receive the output of the phase memory signal from the clock domino and the fifth N-FET source is connected to $V_{SS}$. The dynamic phase shifter and staticizer of claim 7, wherein the output from the staticizer is output from between the second P-FET source and the fourth N-FET drain.

In one or more embodiments, the present invention relates to the dynamic phase shifter and staticizer which includes a test circuit connected in parallel to the dynamic phase shifter and staticizer circuit, wherein the test circuit has a test input and a test output, and wherein the dynamic phase shifter and staticizer circuit and test circuit operate with the same gate delay as the dynamic phase shifter and staticizer circuit operating alone. The test circuit connects to the clock domino between each transistor in the clock domino, and wherein the test circuit connects to the output of the clock domino and the input and output of the staticizer.

In one or more embodiments, the present invention relates to a method to use a dynamic phase shifter and staticizer circuit includes receiving a phase memory signal from a memory array and a clock signal at a clock domino; outputting an intermediate signal from the clock domino; receiving the intermediate signal from the clock domino and the clock signal at a staticizer; outputting a static memory signal from the staticizer; and shifting the static memory signal by one clock cycle from the phase memory signal.

In one or more embodiments, the present invention relates to the method includes sampling the phase memory signal with the dynamic phase shifter and staticizer circuit after a rising edge of the clock signal has been received by the dynamic phase shifter and staticizer circuit, and before a falling edge of the clock signal is received by the dynamic phase shifter and staticizer circuit.

In one or more embodiments, the present invention relates to the method includes connecting a test circuit in parallel to the dynamic phase shifter and staticizer circuit; and operating the dynamic phase shifter and staticizer circuit and test circuit with the same gate delay as the dynamic phase shifter and staticizer circuit operating alone.

Other aspects and advantages of the invention will be apparent from the following description and the appended claims.

DETAILED DESCRIPTION

Figure 1:
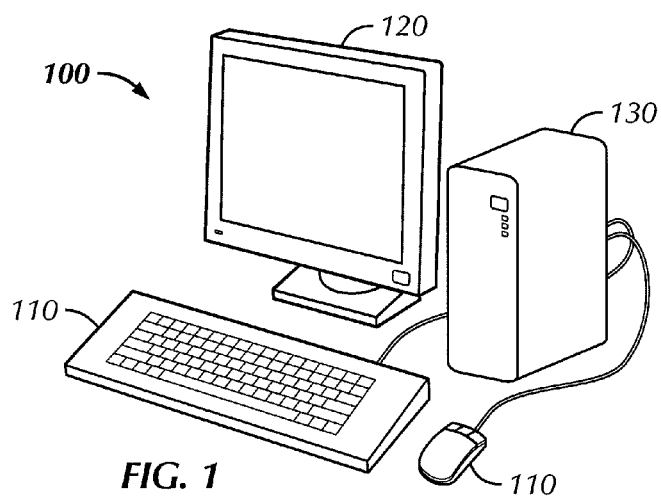
FIG. 1 shows a system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. However, it will be apparent to one with ordinary skill in the art that the invention may be practiced without these specific details. In other instances, well-known features have not been described in detail to avoid obscuring the description of embodiments of the present invention.

FIG. 1 shows a system in accordance with one or more embodiments of the present invention. A system 100 includes input devices 110, an output device 120, and a mechanical chassis 130. The mechanical chassis 130 includes a printed circuit board ("PCB"), a network device, and a storage device (not shown).

Figure 2:
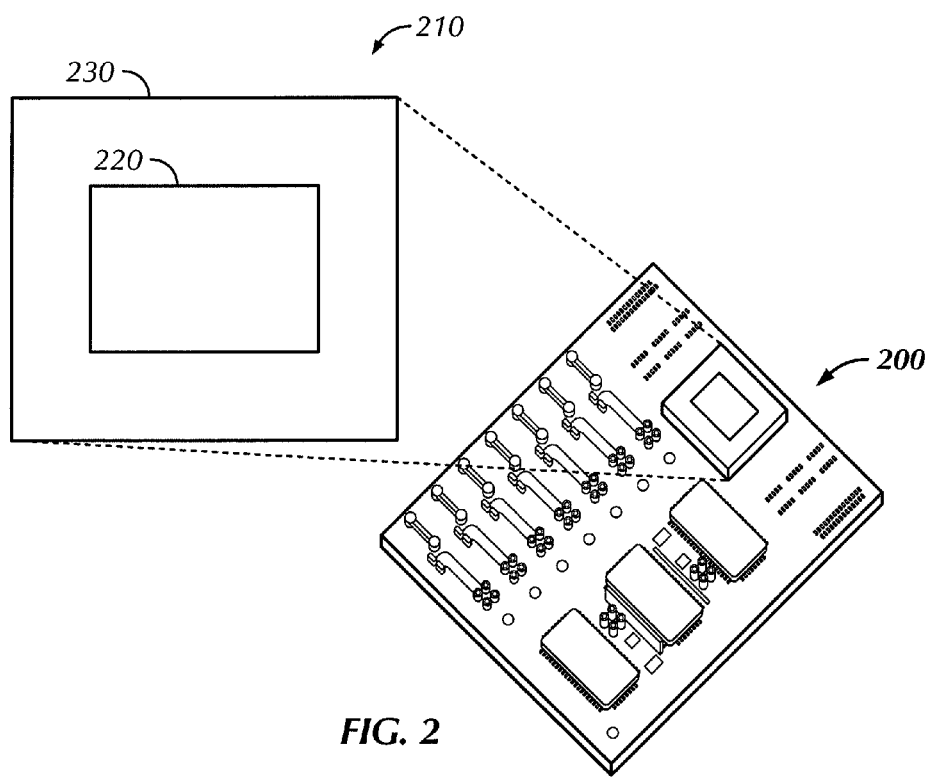
FIG. 2 shows a printed circuit board that includes one or more semiconductor device(s) that each includes one or more semiconductor die in accordance with one or more embodiments of the present invention.

FIG. 2 shows a printed circuit board that includes one or more semiconductor device(s) that each include one or more semiconductor die in accordance with one or more embodiments of the present invention. The PCB 200 may be included in system 100 of FIG. 1 and includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more clock signals and one or more input signals to the semiconductor device 210. The mechanical package 230 provides the external clock and input signal(s) to the die 220. The die 220 is comprised of a plurality of metal layers and a semiconductor layer. The die 220 generates one or more signals that are a function of the provided clock and input signal(s). The clock signals are typically the most heavily loaded, the most widely distributed, and the fastest signals within the die 220. Additionally, the PCB 200 which provides data input signals, which may be dynamically accessed memory signals from memory arrays (not shown), and will provide those signals to the mechanical package 230 which in turn provide them to the die 220. Clock distribution networks are used to provide the clock signals to the proper loads within the die 220.

A significant portion of switching current consumed in latches and flip-flops comes from clock load. The clock signal switches twice every cycle, while logic nodes commonly switch only once every 10 or more cycles. More specifically, some current implementations which shift and staticize a signal require at least 18-22 cycles and some implementations have gate delays of similar size. Therefore, the clock signal generally switches more than 20 times as often as a logic node. Couple that with the large gate delays and cycle delays and it becomes clear that in addition to circuit costs, power consumption costs, and speed costs, these implementations also cost the system processor frequency. As such, latches and flip-flops with reduced clock load may be beneficial to reducing the switching current. Further, it is beneficial if, rather than incurring not only slow switch delay, but also, the gate delay of entire flip-flop or latch circuit in addition to other functional circuit elements that may provide additional benefits such as staticizing signals, a combined and reduced circuit is used that provides the benefits of the flip-flop and the additional functional circuits while incurring less circuit elements and gate delay.

One or more embodiments of the present invention include a circuit that converts a phase signal of a half-cycle in length to a static signal of a full-cycle in length. The circuit converts the signal while also shifting the signal to the next cycle for pipeline purposes. The circuit is able to accomplish both the converting and shifting while incurring only a three gate delay. Additionally, according to one or more embodiments of the present invention, the circuit allows the input to borrow time into the next cycle while sampling because the circuit is transparent for the evaluation phase. Further, one or more embodiments of the invention provide that simple logic such as AND, OR, AND-OR-Invert (AOI), and a multiplexer (or mux) can be built into the overall design which further reduces the overall timing requirement.

Figure 3:
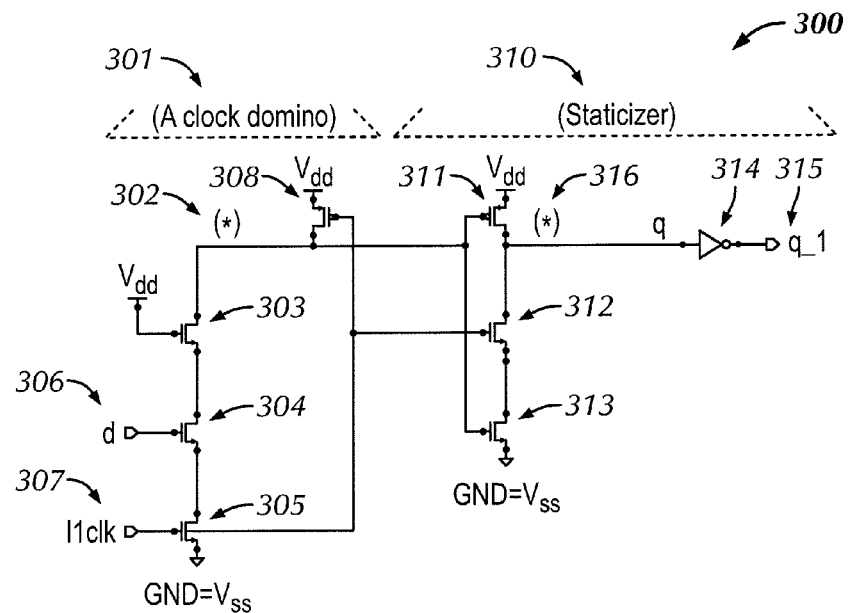
FIG. 3 shows a one-input dynamic phase shifter and staticizer circuit in accordance with one or more embodiments of the present invention.

FIG. 3 shows a dynamic phase shifter and staticizer circuit 300 in accordance with one or more embodiments of the present invention. The circuit 300 consists of two sections, a clock domino circuit 301 and a staticizer circuit 310.

As show in FIG. 3, the clock domino 301 receives inputs of a clock signal 307 and a data input 306. The data input 306 may be a phase memory array signal 306 from a memory array. According to one or more embodiments, the clock signal 307 will have a different phase than the data or phase memory array signal 306. Thus, in order to shift the phase of the input phase memory signal 306 into an intermediate signal 302 which is output, the setup and hold is done with respect to the edge of the clock signal 307. In one or more embodiments of the present invention, the clock domino circuit 301 also provides the ability to borrow time into the next cycle, thus providing a soft boundary for sampling. In one or more embodiments, the timing cost of the clock domino circuit 301 is a one gate delay. According to one or more embodiments of the present invention, the intermediate signal 302 that is output from a clock domino 301 may be the same as the input phase memory signal 306. According to one or more embodiments of the present invention, the intermediate signal's 302 amplitude and timing may be adjusted or shifted by the clock domino 301.

Additionally, FIG. 3 also shows that the staticizer circuit 310 receives inputs of the clock signal 307 and the intermediate signal 302 which is output from the clock domino circuit 301. According to one or more embodiments of the present invention, the output of the staticizer 310 is a static memory signal 316 which is a full-cycle version of the half-cycle intermediate signal 302 that was input and then converted by the staticizer 310. In one or more embodiments the staticizer 310 will also hold the signal values 302 for a whole cycle. In one or more embodiments, the cost of the staticizer 310 is a two gate delay. Further, in one or more embodiments, one of the n-channel field-effect transistors ("N-FET") 313 is sized such that it is a weaker N-FET as compared to the other N-FETs 303, 304, 305, and 312 in the circuit which helps reduce glitch occurrences and severity.

According to one or more embodiments of the present invention, the clock domino circuit 301 includes a p-channel field-effect transistor ("P-FET") 308 and at least a first N-FET 303, a second N-FET 304, and a third N-FET 305 connected in series. One of ordinary skill in the art will recognize that each of the P-FETs and N-FETs have a gate, drain, and source which function as known in the art. According to one or more embodiments of the present invention, the N-FET and P-FET transistors are metal-oxide-semiconductor field-effect transistors (MOSFETs). The P-FET 308 gate is configured to receive the clock signal 307, the P-FET 308 drain is connected to $V_{DD}$, and the P-FET 308 source is connected to the first N-FET 303 drain. The first N-FET 303 gate is connected to $V_{DD}$ and the first N-FET 303 source is connected to the second N-FET 304 drain. The second N-FET 304 gate is configured to receive the phase memory signal 306 and the second N-FET 304 source is connected to the third N-FET 305 drain. The third N-FET 305 gate is configured to receive the clock signal 307 and the third N-FET 305 source is connected to GND ($V_{SS}$). The output 302 from the clock domino is output from between the P-FET 308 source and the first N-FET 303 drain.

According to one or more embodiments of the present invention, the Staticizer 310 includes a second P-FET 311, a fourth N-FET 312, and a fifth N-FET 313 connected in series. The second P-FET 311 gate is configured to receive the output intermediate signal 302 from the clock domino 301. The second P-FET 311 drain is connected to $V_{DD}$, and the second P-FET 311 source is connected to the fourth N-FET 312 drain. The fourth N-FET 312 gate is configured to receive the clock signal 307 and the fourth N-FET 312 source is connected to the fifth N-FET 313 drain. The fifth N-FET 313 gate is configured to receive the output intermediate signal 302 from the clock domino 301 and the fifth N-FET 313 source is connected to $V_{SS}$. The output 316 from the staticizer 310 is output from between the second P-FET 311 source and the fourth N-FET 312 drain. Finally, the output 316 is passed through an inverter 314 producing the final output 315.

Figure 4:
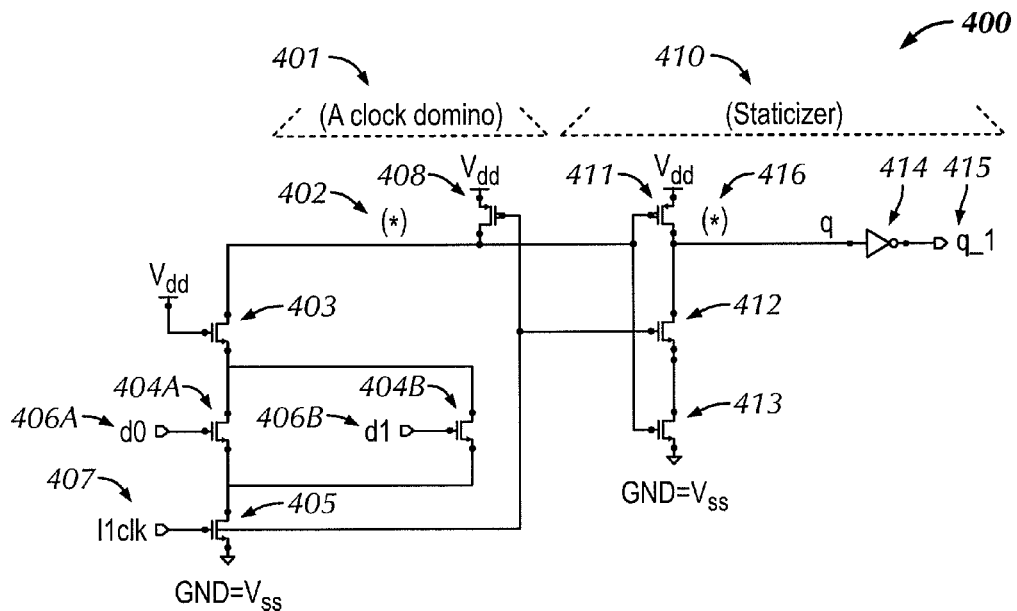
FIG. 4 shows a two-input dynamic phase shifter and staticizer in accordance with one or more embodiments of the present invention.

FIG. 4 shows a two-input dynamic phase shifter and staticizer 400 in accordance with one or more embodiments of the present invention. A person of ordinary skill in the art will appreciate that one or more embodiments of the invention may be provided with additional inputs in excess of two in a similar manner as shown in FIG. 4. The two-input dynamic phase shifter and staticizer 400 of FIG. 4 provides the same delay as the one-input dynamic staticizer 300 of FIG. 3 with no extra delay or gate cost. The two-input dynamic phase shifter and staticizer 400 also provides the same functionality as discussed above for the one-input dynamic phase shifter and staticizer 300 with the additional ability to support at least a second input 406B.

Specifically, according to one or more embodiments of the present invention, the clock domino circuit 401 includes a p-channel field-effect transistor ("P-FET") 408 and at least a first N-FET 403, a pair of second N-FETs 404A and 404B, and a third N-FET 405 connected in series. The P-FET 408 gate is configured to receive the clock signal 407, the P-FET 408 drain is connected to $V_{DD}$, and the P-FET 408 source is connected to the first N-FET 403 drain. The first N-FET 403 gate is connected to $V_{DD}$ and the first N-FET 403 source is connected to both the pair of second N-FETs 404A and 404B drains. The pair of second N-FETs 404A and 404B gates are configured to receive the phase memory signals 406A and 406B, respectively. Further, the pair of second N-FET 404A and 404B sources are connected to the third N-FET 405 drain. The third N-FET 405 gate is configured to receive the clock signal 407 and the third N-FET 405 source is connected to GND ($V_{SS}$). The intermediate output 402 from the clock domino 401 is output from between the P-FET 408 source and the first N-FET 403 drain.

According to one or more embodiments of the present invention, the Staticizer 410 of FIG. 4, which is substantially similar to that of FIG. 3, includes a second P-FET 411, a fourth N-FET 412, and a fifth N-FET 413 connected in series. The second P-FET 411 gate is configured to receive the intermediate output 402, which may be the phase memory signal, from the clock domino 401. The second P-FET 411 drain is connected to $V_{DD}$, and the second P-FET 411 source is connected to the fourth N-FET 412 drain. The fourth N-FET 412 gate is configured to receive the clock signal 407 and the fourth N-FET 412 source is connected to the fifth N-FET 413 drain. The fifth N-FET 413 gate is configured to receive the output intermediate signal 402 from the clock domino 401 and the fifth N-FET 413 source is connected to $V_{SS}$. The output 416 from the staticizer 410 is output from between the second P-FET 411 source and the fourth N-FET 412 drain. Finally, the output 416 is passed through an inverter 414 producing the final output 415.

Figure 5:
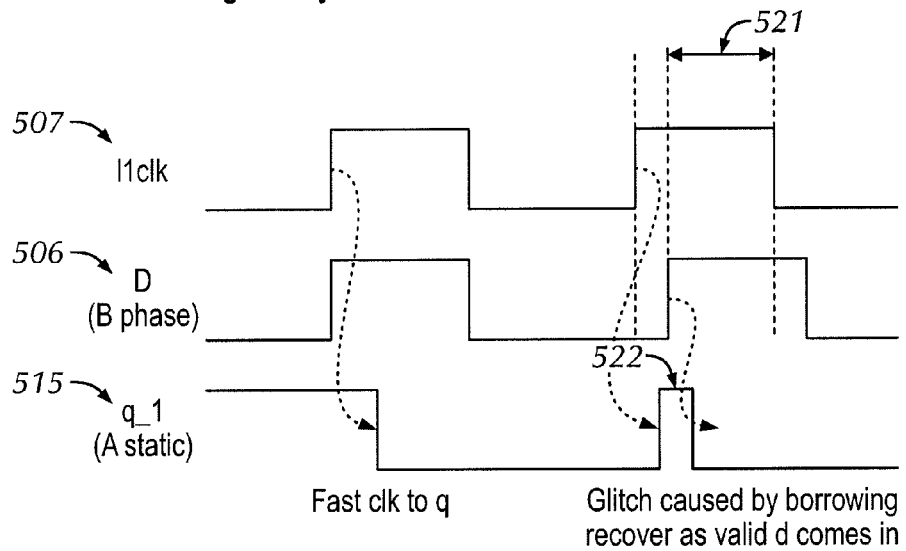
FIG. 5 shows a timing of a dynamic phase shifter and staticizer circuit in accordance with one or more embodiments of the present invention.

FIG. 5 shows a timing diagram of a dynamic phase shifter and staticizer circuit which has inputs of a clock 507 and a data signal 506 and an overall output signal 515 in accordance with one or more embodiments of the present invention. Further, according to one or more embodiments, when an input to the dynamic phase shifter and staticizer circuit, for example the circuits as disclosed in FIGS. 3 and 4, borrow into the next cycle, a glitch 522 will occur in the output signal 515. However, the output 515 will settle into the correct value when the correct input 506 arrives during the window 521 by borrowing time as allowed.

The concept involved in time borrowing can be seen from FIG. 5. In FIG. 5, two adjacent signals 507 and 515 are shown with an overlap between them. In one or more embodiments of the present invention, signal skew, or phase disparity, is present, such that the rising edge of the second bit of the data signal 506 corresponds to the latest possible time for this edge to present normally in a flip-flop for sampling, while the falling edge of the clock signal 515 corresponds to the latest possible time for borrowed time sampling to occur. The interval 521, or window 521, when both the data signal 506 and the clock signal 515 are high is when time borrowing can occur. If necessary, the evaluation of the data signal 506 can extend into the region 521 in which borrowing may occur according to one or more embodiments of the present invention.

The internal arrangement of the clock domino 301 and staticizer 310, along with the arrangement in relation to each other within the phase shifter and staticizer circuit 300 allows for time borrowing to occur while still providing the phase cycle shift and staticizing functionality. Specifically, according to one or more embodiments of the present invention, if the evaluation of the inputs at the clock domino circuit 301 has not completed, its output(s) 302 will be low because of the nature of a domino circuit 301. This, in turn, will temporarily suspend the evaluation process of the staticizer 310 because the inputs 302 to the staticizer is low. When the result from the clock domino circuit 301 become available, then the staticizer 310 can being evaluation. Thus, the boundary between when the clock domino circuit 301 finishes evaluation and when the staticizer 310 begins evaluation or processing is "blurry." In other words, the clock edges have been effectively softened. Soft clock edges allow advantageous time borrowing to occur within the dynamic phase shifter and staticizer circuit 300. In this way, according to one or more embodiments of the present invention, limitations due to delay imbalances between stages are removed, allowing the circuits to operate at a higher speed.

Figure 6:
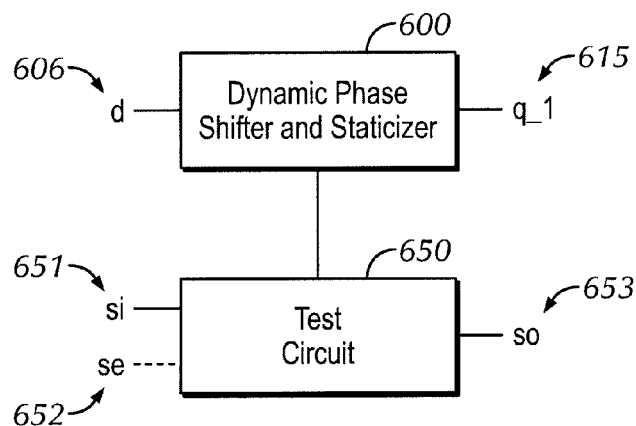
FIG. 6 shows a dynamic phase shifter and staticizer circuit and a test circuit box diagram in accordance with one or more embodiments of the present invention.

FIG. 6 shows a dynamic phase shifter and staticizer circuit 600 and a test circuit 650 box diagram according to one or more embodiments of the present invention. Specifically, a person of ordinary skill in the art will appreciate that, in view of the design and layout of the dynamic phase shifter and staticizer circuit 600, according to one or more embodiments of the present invention, a test circuit 650 can be connected in parallel to the dynamic phase shifter and staticizer circuit 600 without disturbing the input 606 or output 615 and the circuit 600. The test circuit 650 has inputs 651 and 652 and an output 653. Therefore, this arrangement provides a dynamic phase shifter and staticizer circuit 600 with superb scannability and testability.

Figure 7:
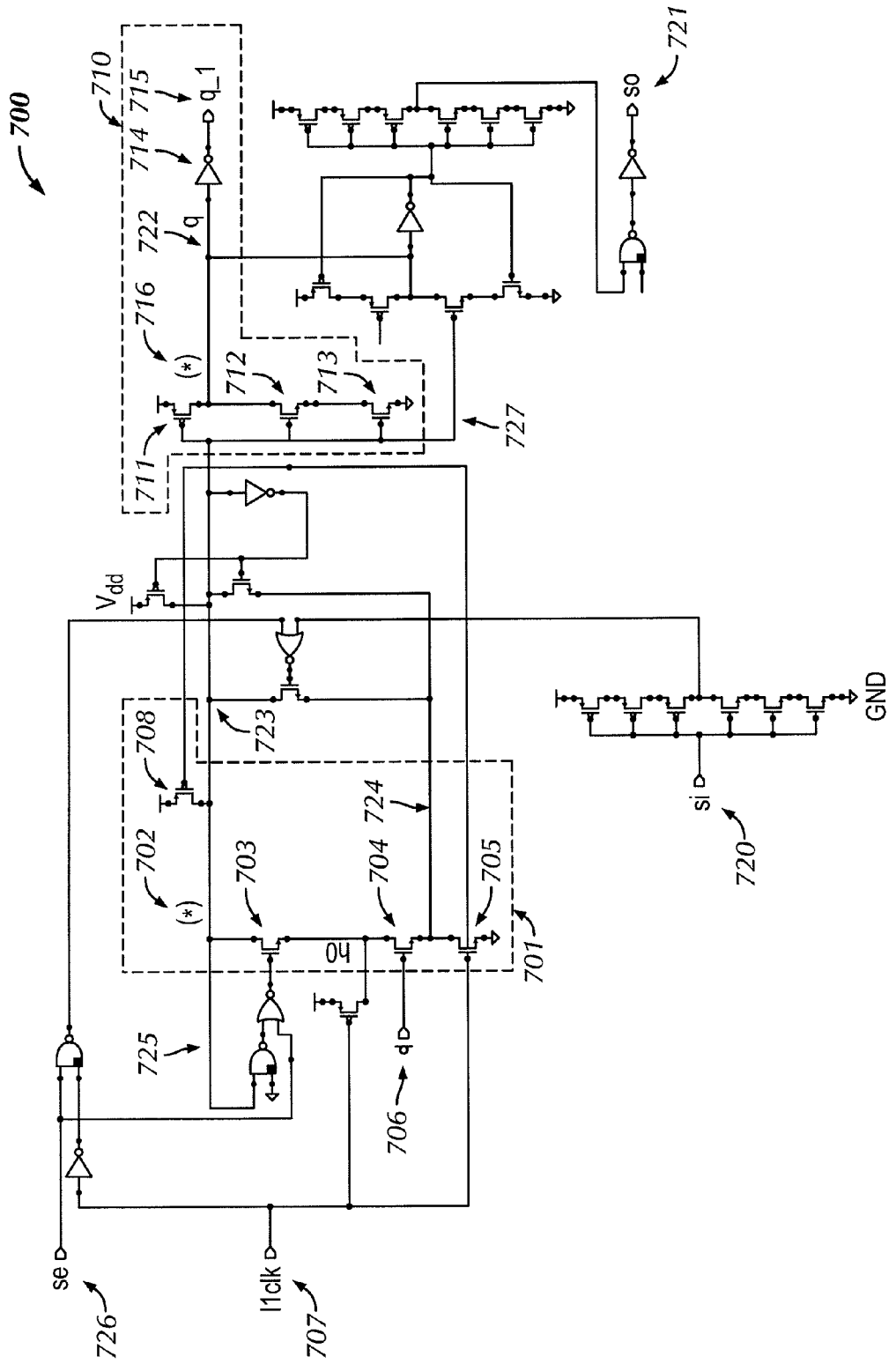
FIG. 7 shows a one-input dynamic phase shifter and staticizer circuit and a test circuit in accordance with one or more embodiments of the present invention.

FIG. 7 shows a dynamic phase shifter and staticizer circuit and a test circuit according to one or more embodiments of the present invention. Specifically, FIG. 7 discloses a dynamic phase shifter and staticizer circuit and test circuit 700 which includes a clock domino 701, a staticizer 710, and other circuitry where the remaining circuitry shown is part of a test circuit which connects to the dynamic phase shifter and staticizer circuit at specific locations in the circuit.

Specifically, in FIG. 7, the clock domino circuit 701 includes a p-channel field-effect transistor ("P-FET") 708 and at least a first N-FET 703, a second N-FET 704, and a third N-FET 705 connected in series. The P-FET 708 gate is configured to receive the clock signal 707, the P-FET 708 drain is connected to $V_{DD}$, and the P-FET 708 source is connected to the first N-FET 703 drain. The first N-FET 703 gate is connected to the test circuit 725 which may provide $V_{DD}$ or an appropriate test signal and the first N-FET 703 source is connected to the second N-FET 704 drain. The second N-FET 704 gate is configured to receive the phase memory signal 706. Further, the second N-FET 704 source is connected to the third N-FET 705 drain and the test circuit connects at this point 724 as well. The third N-FET 705 gate is configured to receive the clock signal 707 and the third N-FET 705 source is connected to GND ($V_{SS}$). The output 702 from the clock domino 701 is output from between the P-FET 708 source and the first N-FET 703 drain at which point the test circuit 723 is also connected. The test circuit inputs signals 726 and 720 through the at least the points 725, 724, and 723 into the dynamic phase shifter and staticizer circuit 700 during circuit testing.

According to one or more embodiments of the present invention, the Staticizer 710 of FIG. 7, which is substantially similar to that of FIG. 3, includes a second P-FET 711, a fourth N-FET 712, and a fifth N-FET 713 connected in series. The second P-FET 711 gate is configured to receive the intermediate output signal 702, which may be the phase memory signal, from the clock domino 701. The second P-FET 711 drain is connected to $V_{DD}$, and the second P-FET 711 source is connected to the fourth N-FET 712 drain. The fourth N-FET 712 gate is configured to receive the clock signal 707 and the fourth N-FET 712 source is connected to the fifth N-FET 713 drain. The fifth N-FET 713 gate is configured to receive the intermediate output signal 702 from the clock domino 701, at which point 727 the test circuit is connected, and the fifth N-FET 713 source is connected to $V_{SS}$. The output 716 from the staticizer 710 is output from between the second P-FET 711 source and the fourth N-FET 712 drain, at which point 722 the test circuit is also connected. The output 716 is passed through an inverter 714 producing the final output 715. Finally, the test circuit takes the signals from the points 727 and 722 and outputs the test output signal 721.

Additionally, according to one or more embodiments of the presenting inventions, scan ports are included at the stage at which a glitch may present, specifically, the test circuit is connected at the output of the staticizer 710 in order to monitor the output 716.

One or more embodiments of the present invention provide that the phase shifter and staticizer circuit is used in a cache, specifically, an L3 cache. The phase shifter and staticizer circuit is placed in the cache to speed up the critical timing. Further, according to one or more embodiments of the present invention, the phase shifter and staticizer circuit can be used in all memory arrays on a processor to speed up all critical paths timing.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A dynamic phase shifter and staticizer circuit comprising:
   a clock domino configured to receive a phase memory signal from a memory array and a clock signal and output an intermediate signal; and
   a staticizer configured to receive the intermediate signal from the clock domino and the clock signal and output a static memory signal,
   wherein a state of the static memory signal switches when the clock signal is in an out of phase state with respect to the phase memory signal, thereby shifting the static memory signal from the phase memory signal.

2. The dynamic phase shifter and staticizer of claim 1, wherein the clock signal further comprises:
   a clock edge; and
   a different phase than the phase memory signal,
   wherein setup and holding of the static memory signal is done with respect to the clock edge, shifting the output of the clock domino, and
   wherein the received phase memory signal can borrow into a next cycle when being sampled.

3. The dynamic phase shifter and staticizer circuit of claim 1,
   wherein the phase memory signal is converted from a half-cycle in length to the static memory signal that is a full-cycle in length.

4. The dynamic phase shifter and staticizer circuit of claim 3, wherein the staticizer staticizes the memory signal from the half-cycle to the full-cycle long memory signal.

5. The dynamic phase shifter and staticizer circuit of claim 1,
   wherein the dynamic phase shifter and staticizer circuit is configured to sample the phase memory signal after a rising edge of the clock signal has been received by the dynamic phase shifter and staticizer circuit, and
   wherein the dynamic phase shifter and staticizer circuit is configured to sample the phase memory signal before a falling edge of the clock signal is received by the dynamic phase shifter and staticizer circuit.

6. The dynamic phase shifter and staticizer circuit of claim 1, wherein the clock domino further comprises:
   a p-channel field-effect transistor ("P-FET") and at least a first n-channel field-effect transistor ("N-FET"), a second N-FET, and a third N-FET connected in series, wherein the P-FET gate is configured to receive the clock signal, the P-FET drain is connected to $V_{DD}$, and the P-FET source is connected to the first N-FET drain, wherein the first N-FET gate is connected to $V_{DD}$ and the first N-FET source is connected to the second N-FET drain, wherein the second N-FET gate is configured to receive the phase memory signal and the second N-FET source is connected to the third N-FET drain, and wherein the third N-FET gate is configured to receive the clock signal and the third N-FET source is connected to $V_{SS}$.

7. The dynamic phase shifter and staticizer of claim 5, wherein the output from the clock domino is output from between the P-FET source and the first N-FET drain.

8. The dynamic phase shifter and staticizer circuit of claim 1, wherein the staticizer further comprises:
   a second P-FET, a fourth N-FET, and a fifth N-FET connected in series,
   wherein the second P-FET gate is configured to receive the output of the phase memory signal from the clock domino, the second P-FET drain is connected to $V_{DD}$, and the second P-FET source is connected to the fourth N-FET drain,
   wherein the fourth N-FET gate is configured to receive the clock signal and the fourth N-FET source is connected to the fifth N-FET drain, and
   wherein the fifth N-FET gate is configured to receive the output of the phase memory signal from the clock domino and the fifth N-FET source is connected to $V_{SS}$.

9. The dynamic phase shifter and staticizer of claim 7, wherein the output from the staticizer is output from between the second P-FET source and the fourth N-FET drain.

10. The dynamic phase shifter and staticizer circuit of claim 1, further comprising:
    a test circuit connected in parallel to the dynamic phase shifter and staticizer circuit,
    wherein the test circuit has a test input and a test output, and
    wherein the dynamic phase shifter and staticizer circuit and test circuit operate with the same gate delay as the dynamic phase shifter and staticizer circuit operating alone.

11. The dynamic phase shifter and staticizer circuit of claim 10,
    wherein the test circuit connects to the clock domino between each transistor in the clock domino, and
    wherein the test circuit connects to the output of the clock domino and the input and output of the staticizer.

12. The dynamic phase shifter and staticizer circuit of claim 1, wherein the dynamic phase shifter and staticizer circuit comprises a three gate delay.

13. The dynamic phase shifter and staticizer circuit of claim 1, wherein the dynamic phase shifter and staticizer circuit further comprises:
    a plurality of input signals from a memory array,
    wherein the input signals are input to a plurality of N-FETs connected in parallel.

14. A method to use a dynamic phase shifter and staticizer circuit comprising:
    receiving a phase memory signal from a memory array and a clock signal at a clock domino;
    outputting an intermediate signal from the clock domino;
    receiving the intermediate signal from the clock domino and the clock signal at a staticizer; and
    outputting a static memory signal from the staticizer; and
    switching a state of the static memory signal when the clock signal is in an out of phase state with respect to the phase memory signal, thereby shifting the static memory signal with respect to the phase memory signal.

15. The method of claim 14, further comprising:
    staticizing the memory signal with the staticizer from a half cycle to a whole cycle long memory signal.

16. The method of claim 14, further comprising:
    sampling the phase memory signal with the dynamic phase shifter and staticizer circuit after a rising edge of the clock signal has been received by the dynamic phase shifter and staticizer circuit, and before a falling edge of the clock signal is received by the dynamic phase shifter and staticizer circuit.

17. The method of claim 14, further comprising:
    connecting a test circuit in parallel to the dynamic phase shifter and staticizer circuit; and
    operating the dynamic phase shifter and staticizer circuit and test circuit with the same gate delay as the dynamic phase shifter and staticizer circuit operating alone.

18. The method of claim 14, wherein the dynamic phase shifter and staticizer circuit comprises a three gate delay.

19. The method of claim 14, further comprising:
    decreasing a critical path timing for the memory array with the dynamic phase shifter and staticizer circuit.

20. The method of claim 14, further comprising:
    converting the phase memory signal from a half-cycle in length to the static memory signal that is a full-cycle in length.

* * * * *

UNITED STATES PATENT AND TRADEMARK OFFICE
CERTIFICATE OF CORRECTION

| | | |
|---|---|---|
| PATENT NO. | : 8,699,296 B2 | Page 1 of 1 |
| APPLICATION NO. | : 13/272822 | |
| DATED | : April 15, 2014 | |
| INVENTOR(S) | : Kao | |

It is certified that error appears in the above-identified patent and that said Letters Patent is hereby corrected as shown below:

In the Claims

In column 8, line 40, in Claim 2, after "holding" delete "of the static memory signal".

In Column 8, line 36, in Claim 2, delete "The dynamic phase shifter and staticizer" and insert --The dynamic phase shifter and staticizer circuit--, therefor.

In Column 9, line 13, in Claim 7, delete "The dynamic phase shifter and staticizer" and insert --The dynamic phase shifter and staticizer circuit--, therefor.

In Column 9, line 31, in Claim 9, delete "The dynamic phase shifter and staticizer" and insert --The dynamic phase shifter and staticizer circuit--, therefor.

Signed and Sealed this
Twenty-third Day of June, 2015

Michelle K. Lee
*Director of the United States Patent and Trademark Office*